United States Patent
Lee et al.

(10) Patent No.: US 9,477,358 B2
(45) Date of Patent: Oct. 25, 2016

(54) TOUCH SCREEN PANEL AND METHOD OF MANUFACTURING THE SAME

(71) Applicant: Samsung Display Co., Ltd., Yongin, Gyeonggi-Do (KR)

(72) Inventors: Byeong-Jin Lee, Suwon-si (KR); Joo-Han Bae, Seongnam-si (KR); Byeongkyu Jeon, Busan (KR); Sungku Kang, Suwon-si (KR); Jinhwan Kim, Seoul (KR); Heewoong Park, Hwaseong-si (KR); Jee-Hun Lim, Seongnam-si (KR)

(73) Assignee: Samsung Display Co., Ltd. (KR)

( * ) Notice: Subject to any disclaimer, the term of this patent is extended or adjusted under 35 U.S.C. 154(b) by 212 days.

(21) Appl. No.: 14/254,537

(22) Filed: Apr. 16, 2014

(65) Prior Publication Data

US 2015/0107977 A1  Apr. 23, 2015

(30) Foreign Application Priority Data

Oct. 18, 2013 (KR) ........................ 10-2013-0124695

(51) Int. Cl.
  *H01H 13/70* (2006.01)
  *G06F 3/044* (2006.01)

(52) U.S. Cl.
  CPC ..... *G06F 3/044* (2013.01); *G06F 2203/04103* (2013.01); *G06F 2203/04111* (2013.01); *G06F 2203/04112* (2013.01); *H03K 2217/96075* (2013.01); *H03K 2217/960755* (2013.01)

(58) Field of Classification Search
  CPC ........................... H03K 17/9622; G06F 3/044
  USPC ........................................................ 200/600
  See application file for complete search history.

(56) References Cited

U.S. PATENT DOCUMENTS

| | | | | |
|---|---|---|---|---|
| 7,824,972 | B2 * | 11/2010 | Choung | G02F 1/136227 438/158 |
| 8,044,398 | B2 * | 10/2011 | Ning | G02F 1/136286 257/350 |
| 2010/0245369 | A1 * | 9/2010 | Yoshino | G06F 3/1438 345/522 |
| 2010/0295819 | A1 * | 11/2010 | Ozeki | G06F 3/044 345/174 |
| 2011/0099805 | A1 | 5/2011 | Lee | |
| 2012/0018200 | A1 | 1/2012 | Kim et al. | |
| 2013/0038542 | A1 * | 2/2013 | Kim | G06F 3/041 345/173 |
| 2013/0038571 | A1 * | 2/2013 | Ho | G06F 3/044 345/174 |
| 2013/0146333 | A1 | 6/2013 | Cheng | |
| 2013/0147730 | A1 | 6/2013 | Chien et al. | |

(Continued)

FOREIGN PATENT DOCUMENTS

| JP | 2011-060146 | 3/2011 |
|---|---|---|
| KR | 10-2006-0043710 A | 5/2006 |
| KR | 10-2010-0048144 A | 5/2010 |

(Continued)

*Primary Examiner* — Kyung Lee
(74) *Attorney, Agent, or Firm* — Innovation Counsel LLP

(57) ABSTRACT

A touch screen panel includes a touch substrate, first sensing electrodes, second sensing electrodes, and outer lines. The touch substrate includes a touch active area and a touch non-active area. The first and second sensing electrodes are disposed in the touch active area and insulated from each other while crossing each other. Each first sensing electrode includes a first sensing metal layer and a first transparent sensing electrode layer. Each second sensing electrode includes a second sensing metal layer and a second transparent sensing electrode layer. Each outer line includes a first outer metal layer, a transparent outer electrode layer, and a second outer metal layer.

21 Claims, 9 Drawing Sheets

(56) References Cited

U.S. PATENT DOCUMENTS

2013/0147742 A1   6/2013   Lee
2013/0335345 A1*  12/2013  Liu .................... G06F 3/041
                                              345/173

FOREIGN PATENT DOCUMENTS

| KR | 10-2012-0094574 A | 8/2012 |
| KR | 10-2013-0022170 A | 3/2013 |
| KR | 10-2013-0035509 A | 4/2013 |

\* cited by examiner

TOUCH SCREEN PANEL AND METHOD OF MANUFACTURING THE SAME

CROSS-REFERENCE TO RELATED APPLICATION

This U.S. non-provisional patent application claims priority under 35 U.S.C. §119 to Korean Patent Application No. 10-2013-0124695, filed on Oct. 18, 2013, the contents of which are hereby incorporated by reference in their entirety.

BACKGROUND

1. Field of Disclosure

The present disclosure relates generally to a touch screen panel and a method of manufacturing the same. More particularly, the present disclosure relates to a touch screen panel including outer lines each having a three- or more-layered structure and sensing electrodes each having a two- or more-layered structure, as well as a method of manufacturing the touch screen panel.

2. Description of the Related Art

A touch screen panel is used as an input device to allow a user to select displayed content on an image display apparatus by touching a finger or other object to the touch panel.

To this end, the touch screen panel is disposed on a front surface of the image display apparatus to generate an electrical signal indicating a position at which the finger or other object directly touches. Accordingly, the contents corresponding to the touch position are used as an input signal.

Since various input devices connected to the image display apparatus, e.g., a keyboard, a mouse, etc., are replaced by the touch screen panel, in recent years, the touch screen panel has seen an increase in demand.

The touch screen panel is classified into a resistive film type touch screen panel, a light sensing type touch screen panel, and an electrostatic capacitive type touch screen panel.

The electrostatic capacitive type touch screen panel senses a variation in electrostatic capacitance between a conductive sensing electrode and another sensing electrode adjacent thereto or a ground electrode, to generate the electrical signal indicating the touch position.

In general, sensing electrodes and outer lines, which are included in the electrostatic capacitance type touch screen panel, are configured to include a first metal layer and a second metal layer formed on the first metal layer. In this case, a metal material used to form the first metal layer has an electronegativity value similar to that of a metal material used to form the second metal layer. The first metal layer is etched together with the second metal layer when the second metal layer is etched to form the sensing electrodes. As a result, the first metal layer can be overetched, potentially leading to defects in the sensing electrodes.

SUMMARY

The present disclosure provides a touch screen panel capable of reducing defects of outer lines and sensing electrodes.

The present disclosure provides a method of manufacturing the touch screen panel to reduce the defects of the outer lines and the sensing electrodes.

Embodiments of the inventive concept provide a touch screen panel including a touch substrate, first sensing electrodes, second sensing electrodes, and outer lines. The touch substrate includes a touch active area and a touch non-active area outside the touch active area to substantially surround the touch active area. The first sensing electrodes are positioned so as to collectively extend along a first direction within the touch active area, and are spaced apart from each other. The second sensing electrodes are positioned so as to collectively extend along a second direction within the touch active area, are spaced apart from each other, and are insulated from the first sensing electrodes. The second direction can cross the first direction. The outer lines are disposed in the touch non-active area and connected to the first and second sensing electrodes. Each of the first sensing electrodes includes a first sensing metal layer and a first transparent sensing electrode layer disposed on the first sensing metal layer, each of the second sensing electrodes includes a second sensing metal layer and a second transparent sensing electrode layer disposed on the second sensing metal layer, and each of the outer lines includes a first outer metal layer, a transparent outer electrode layer disposed on the first outer metal layer, and a second outer metal layer disposed on the transparent outer electrode layer.

The first sensing metal layer, the second sensing metal layer, and the first outer metal layer can be disposed on the same layer, and the first transparent sensing electrode layer, the second transparent sensing electrode layer, and the transparent outer electrode layer can be disposed on the same layer.

The first sensing electrodes can include a plurality of first unit sensing electrodes arranged in columns of spaced-apart ones of the first unit sensing electrodes, the columns extending along the first direction and being spaced apart from each other along the second direction, and the second sensing electrodes can include a plurality of second unit sensing electrodes arranged in rows of the second unit sensing electrodes, the rows extending along the second direction and the second unit sensing electrodes of each row being spaced apart from each other and connected to each other along the first direction.

The touch screen panel can further include a bridge disposed on the touch substrate to connect pairs of the first unit sensing electrodes, the first unit sensing electrodes of the pairs being spaced apart from each other in the second direction.

The first sensing metal layer, the second sensing metal layer, and the first outer metal layer can comprise a silver nano-wire and/or PEDOT-PSS(poly(3,4-ethylenedioxythiophene)poly(styrenesulfonate).

The first transparent sensing electrode layer, the second transparent sensing electrode layer, and the transparent outer electrode layer can include at least one selected from the group consisting of indium tin oxide (ITO), indium zinc oxide (IZO), indium gallium zinc oxide (IGZO), and aluminum-doped zinc oxide (ZAO).

The second outer metal layer and the bridge can include the same metal material. The second outer metal layer and the bridge can include at least one metal material selected from the group consisting of Cu, Ag, Au, Pt, and Al.

Embodiments of the inventive concept also provide a method of manufacturing a touch screen panel, including receiving a touch substrate including a touch active area and a touch non-active area disposed outside the touch active area to substantially surround the touch active area, forming a first metal layer on the touch substrate, forming a transparent electrode layer on the first metal layer, forming a second metal layer on the transparent electrode layer, patterning the first metal layer, the transparent electrode layer, and the second metal layer to form a first sensing pattern and a second sensing pattern in the touch active area and to form outer lines in the touch non-active area, and selectively etching a third sensing metal layer of the first sensing pattern and a fourth sensing metal layer of the second sensing pattern to form first unit sensing electrodes and second unit sensing electrodes and to form a touch screen pattern.

The first metal layer can be formed by depositing a metal material containing a silver nano-wire.

The transparent electrode layer can be formed by depositing at least one selected from the group consisting of ITO, IZO, IGZO, and ZAO.

The second metal layer can be formed by depositing at least one selected from the group consisting of Cu, Ag, Au, Pt, and Al.

The patterning can further include forming a photoresist layer on the second metal layer, performing an exposure and development process on the photoresist layer using a first mask so as to form a first photoresist pattern, and etching the second metal layer, the transparent electrode layer, and the first metal layer using the first photoresist pattern as a mask so as to form the first and second sensing patterns and the outer lines. The selectively etching can further include selectively etching and removing the first photoresist pattern corresponding to the first and second sensing patterns using a second mask so as to form a second photoresist pattern and etching the third sensing metal layer of the first sensing pattern and the second sensing metal layer of the second sensing pattern using the second photoresist pattern as a mask.

The patterning can further include forming a photoresist layer on the second metal layer, performing an exposure and development process on the photoresist layer using a third mask so as to form a third photoresist pattern corresponding to the first and second sensing patterns and having a first thickness, and so as to form a fourth photoresist pattern corresponding to the outer lines and having a second thickness greater than the first thickness, and etching the second metal layer, the transparent electrode layer, and the first metal layer using the third and fourth photoresist patterns so as to form the first sensing pattern, the second sensing pattern, and the outer lines. The selectively etching may further include etching the third and fourth photoresist patterns until the third photoresist pattern is substantially completely removed, so as to form a fifth photoresist pattern having a third thickness smaller than the second thickness, and etching the third sensing metal layer of the first sensing pattern and the fourth sensing metal layer of the second sensing pattern using the fifth photoresist pattern as a mask.

The method can further include, after the selectively etching, forming an insulating layer on the touch substrate to cover the first unit sensing electrodes, the second unit sensing electrodes, and the outer lines. The method can further include, after the forming an insulating layer, forming a bridge on the touch substrate to connect pairs of the first unit sensing electrodes. The second metal layer and the bridge can be formed of the same metal material and the bridge can include at least one metal material selected from the group consisting of Cu, Ag, Au, Pt, and Al.

According to the above, since the third sensing metal layer of the first sensing pattern and the fourth sensing metal layer of the second sensing pattern are selectively etched, defects may be prevented from occurring in the sensing electrodes and the outer lines, which are included in the touch screen panel.

BRIEF DESCRIPTION OF THE DRAWINGS

The above and other advantages of the present disclosure will become readily apparent by reference to the following detailed description when considered in conjunction with the accompanying drawings, wherein.

Figure 1:
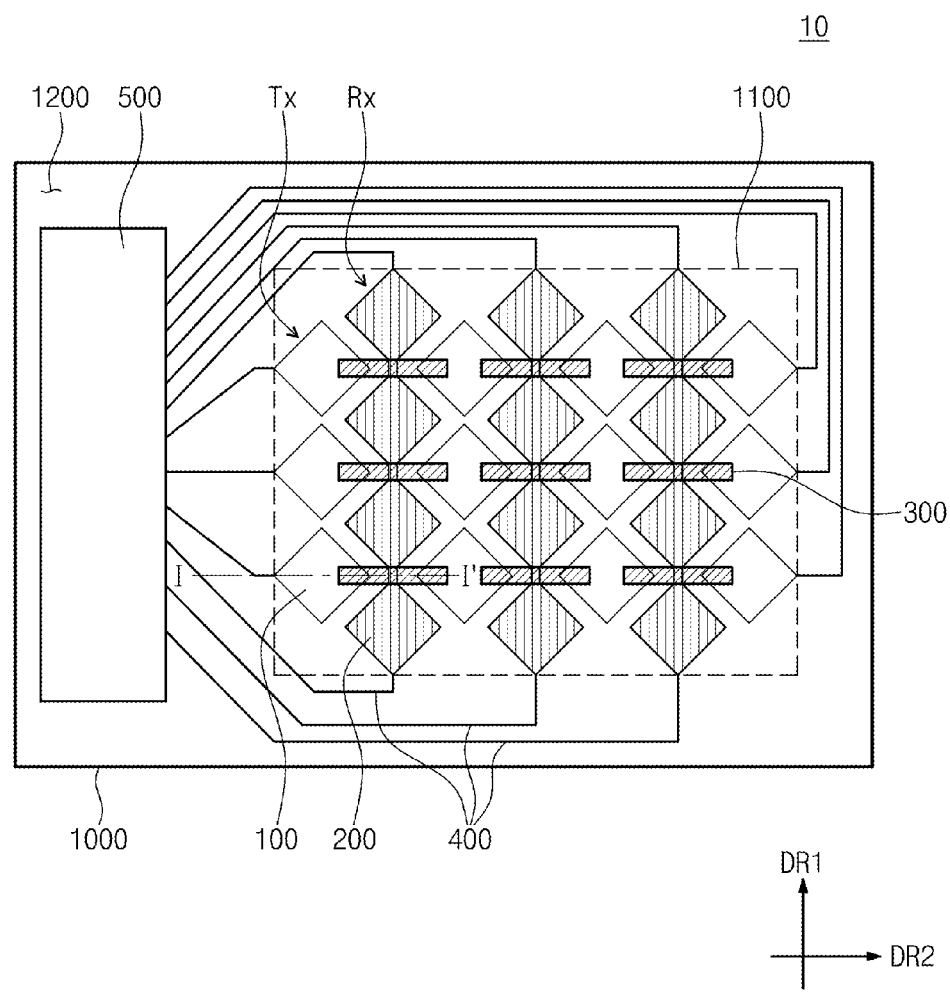
FIG. 1 is a plan view showing a touch screen panel according to an exemplary embodiment of the present disclosure.

The various Figures are not to scale.

DETAILED DESCRIPTION

It will be understood that when an element or layer is referred to as being "on", "connected to" or "coupled to" another element or layer, it can be directly on, connected or coupled to the other element or layer or intervening elements or layers may be present. In contrast, when an element is referred to as being "directly on," "directly connected to" or "directly coupled to" another element or layer, there are no intervening elements or layers present. Like numbers refer to like elements throughout. As used herein, the term "and/or" includes any and all combinations of one or more of the associated listed items.

It will be understood that, although the terms first, second, etc. may be used herein to describe various elements, components, regions, layers and/or sections, these elements, components, regions, layers and/or sections should not be limited by these terms. These terms are only used to distinguish one element, component, region, layer or section from another region, layer or section. Thus, a first element, component, region, layer or section discussed below could be termed a second element, component, region, layer or section without departing from the teachings of the present invention.

Spatially relative terms, such as "beneath", "below", "lower", "above", "upper" and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the exemplary term "below" can encompass both an orientation of above and below. The device may be otherwise oriented (rotated 90 degrees or at other orientations) and the spatially relative descriptors used herein interpreted accordingly.

The terminology used herein is for the purpose of describing particular embodiments only and is not intended to be limiting of the invention. As used herein, the singular forms, "a", "an" and "the" are intended to include the plural forms as well, unless the context clearly indicates otherwise. It will be further understood that the terms "includes" and/or "including", when used in this specification, specify the presence of stated features, integers, steps, operations, elements, and/or components, but do not preclude the presence or addition of one or more other features, integers, steps, operations, elements, components, and/or groups thereof.

Unless otherwise defined, all terms (including technical and scientific terms) used herein have the same meaning as commonly understood by one of ordinary skill in the art to which this invention belongs. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

Hereinafter, the present invention will be explained in detail with reference to the accompanying drawings.

Figure 2:
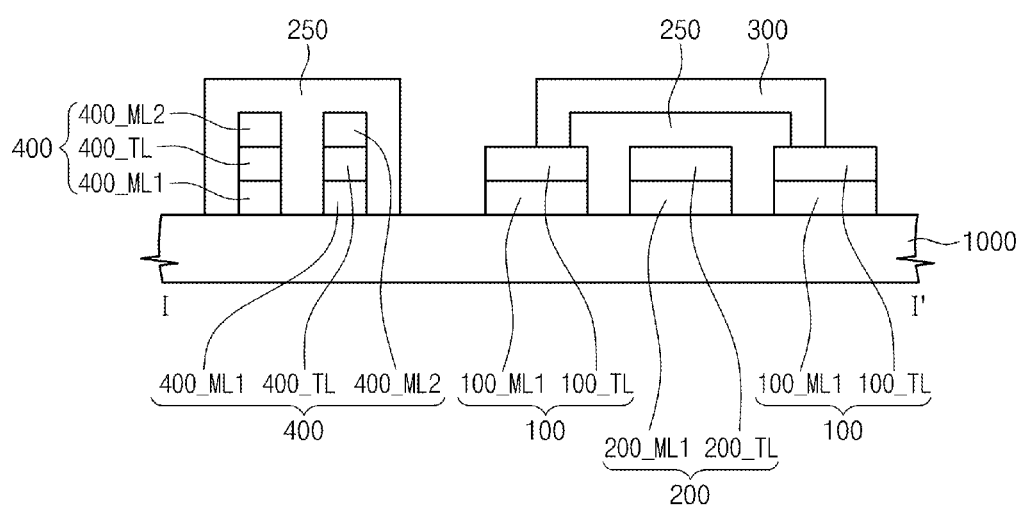
FIG. 2 is a cross-sectional view taken along a line I-I' of FIG. 1.

FIG. 1 is a plan view showing a touch screen panel according to an exemplary embodiment of the present disclosure and FIG. 2 is a cross-sectional view taken along a line I-I' of FIG. 1.

Referring to FIG. 1, a touch screen panel 10 includes a touch substrate 1000 including a touch active area 1100 and a touch non-active area 1200 disposed outside and surrounding the touch active area 1100, first sensing electrodes Tx extending in a first direction DR1 in the touch active area 1100 and being arranged to be spaced apart from each other, second sensing electrodes Rx extending in a second direction DR2 crossing the first direction DR1 in the touch active area 1100, being arranged to be spaced apart from each other, and being insulated from the first sensing electrodes Tx, outer lines 400 arranged in the touch non-active area 1200 and connected to the first and second sensing electrodes Tx and Rx, and a pad part 500 disposed in the touch non-active area 1200 and connected to the outer lines 400.

A touch input may be input to the touch substrate 1000 by a user. The touch substrate 1000 may be formed of various materials such as a plastic material, a glass material, a ceramic material, and a polymer material, but it should not be limited thereto or thereby. The touch substrate 1000 has a plate-like shape, but the shape of the touch substrate 1000 should not be limited to this plate-like shape.

The first and second sensing electrodes Tx and Rx arranged in the touch active area 1100 sense a touch event occurring on the touch active area 1100. When the touch event occurs (i.e. when the user touches the touch active area 1100), a variation in capacitance between the first sensing electrodes TX and the second sensing electrodes Rx occurs, and a sensing signal sensed by the outer lines 400 and the pad part 500 is delayed. The touch screen panel 10 calculates a touch coordinate from the delay value of the sensing signal.

In addition, the outer lines 400 and the pad part 500 are disposed in the touch non-active area 1200 surrounding the touch active area 1100. Although not shown in the Figures, the pad part 500 may include a touch processor electrically connected to the first and second sensing electrodes Tx and Rx through the outer lines 400 and the touch processor may include a signal supplier and a signal processor. The signal supplier sequentially applies the sensing signal to the first and second sensing electrodes Tx and Rx, and the signal processor senses the delay value of the sensing signal to generate the touch coordinate.

The first sensing electrodes Tx include a plurality of first unit sensing electrodes 100. The first unit sensing electrodes 100 are arranged to be spaced apart from each other in the first and second directions DR1 and DR2. In addition, the second sensing electrodes Rx include a plurality of second unit sensing electrodes 200. The second unit sensing electrodes 200 are arranged to be spaced apart from each other in the second direction DR2 and connected to each other in the first direction DR1.

Referring to FIG. 2, each of the first unit sensing electrodes 100 includes a first sensing metal layer 100_ML1 and a first transparent sensing electrode layer 100_TL disposed on the first sensing metal layer 100_ML1, each of the second unit sensing electrodes 200 includes a second sensing metal layer 200_ML1 and a second transparent sensing electrode layer 200_TL disposed on the second sensing metal layer 200_ML1, and each of the outer lines 400 includes a first outer metal layer 400-ML1, a transparent outer electrode layer 400_TL disposed on the first outer metal layer 400_ML1, and a second outer metal layer 400_ML2 disposed on the transparent outer electrode layer 400_TL.

The first sensing metal layer 100_ML1, the second sensing metal layer 200_ML1, and the first outer metal layer 400_ML may include silver nano-wire and/or PEDOT-PSS (poly(3,4-ethylenedioxythiophene)poly(styrenesulfonate).

In addition, the first transparent sensing electrode layer 100_TL, the second transparent sensing electrode layer 200_TL, and the transparent outer electrode layer 400_TL may include at least one selected from the group consisting of indium tin oxide (ITO), indium zinc oxide (IZO), indium gallium zinc oxide (IGZO), and aluminum-doped zinc oxide (ZAO).

Referring to FIG. 2, the touch screen panel 10 may further include an insulating layer 250 to partially or fully cover the first unit sensing electrodes 100, the second unit sensing electrodes 200, and the outer lines 400 and to insulate the first unit sensing electrodes 100, the second unit sensing electrodes 200, and the outer lines 400 from each other.

In addition, as shown in FIGS. 1 and 2, the touch screen panel 10 may further include a bridge 300 disposed above the touch substrate 100 to connect the first unit sensing electrodes 100 to each other, which are disposed to be spaced apart from each other in the second direction DR2. The first unit sensing electrodes 100 are electrically connected to each other by the bridge 300. That is, first unit sensing electrodes 100 that are adjacent to each other in direction DR2 are electrically connected by a bridge 300.

The second outer metal layer 400_ML2 and the bridge 300 may include the same metal material. In detail, the second outer metal layer 400_ML2 and the bridge 300 may include at least one metal material selected from the group consisting of Cu, Ag, Au, Pt, and Al, but they should not be limited thereto or thereby. In this case, the metal material selected from the group consisting of Cu, Ag, Au, Pt, and Al has a low resistance, and thus a low resistance touch screen panel may be realized.

Meanwhile, the outer lines 400 are connected to a flexible printed circuit board (not shown) via the pad part 500, and thus connected to an external driving circuit (not shown) as shown in FIG. 1.

Although not shown in the Figures, the touch screen panel 10 may further include an oxidation preventing layer disposed on the touch substrate 1000 to cover the first sensing electrodes Tx, the second sensing electrodes Rx, and the outer lines 400.

Hereinafter, a manufacturing method for the touch screen panel will be described in detail according to an exemplary embodiment of the present disclosure.

Figure 3:
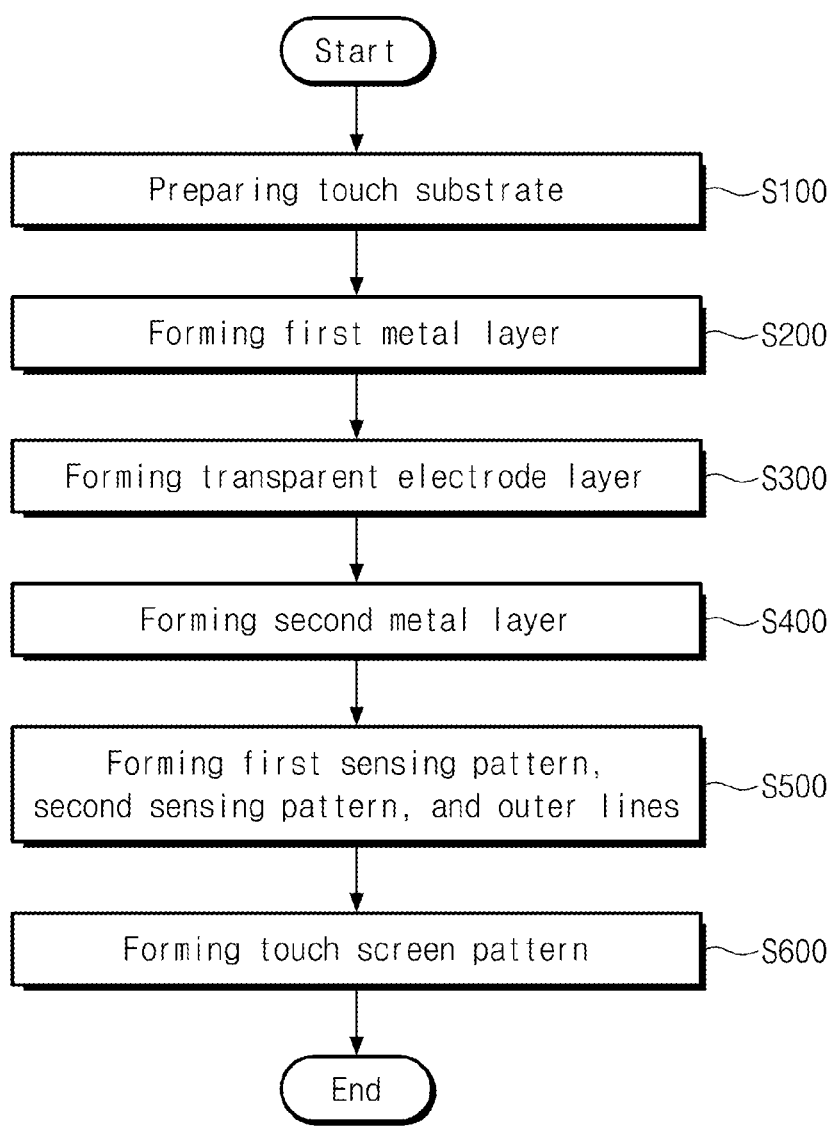
FIG. 3 is a flowchart showing a method of manufacturing the touch screen panel according to an exemplary embodiment of the present disclosure.

FIG. 3 is a flowchart showing a manufacturing method for the touch screen panel according to an exemplary embodiment of the present disclosure.

Referring to FIG. 3, the manufacturing method includes preparing the touch substrate including the touch active area and the touch non-active area surrounding the touch active area (S100), forming a first metal layer on the touch substrate (S200), forming a transparent electrode layer on the first metal layer (S300), forming a second metal layer on the transparent electrode layer (S400), patterning the first metal layer, the transparent electrode layer, and the second metal layer to form first and second sensing patterns in the touch active area and to form the outer lines in the touch non-active area (S500), and selectively etching a third sensing metal layer of the first sensing pattern and a fourth sensing metal layer of the second sensing pattern to form the first unit sensing electrodes and the second unit sensing electrodes (S600).

FIGS. 4 to 10 are cross-sectional views showing a manufacturing method for the touch screen panel using first and second masks.

Figure 4:
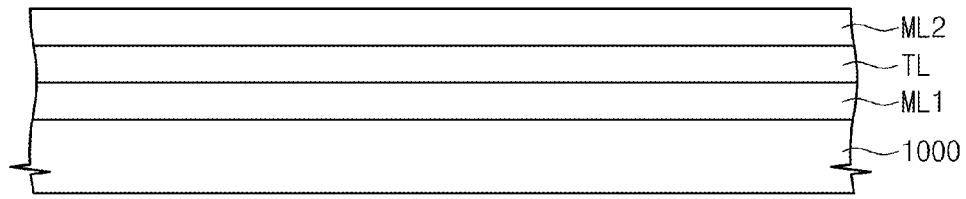
FIGS. 4 to 10 are cross-sectional views showing a manufacturing method of the touch screen panel using first and second masks.

Referring to FIGS. 3 and 4, the touch substrate 1000 is prepared (S100). The touch input may be input to the touch substrate 1000 by the user. The touch substrate 1000 may be formed of various materials such as a plastic material, a glass material, a ceramic material, and a polymer material, but it should not be limited thereto or thereby. The touch substrate 1000 has a plate-like (i.e. flat and generally quadrilateral) shape, but the shape of the touch substrate 1000 should not be limited to a plate-like shape, and can be any suitable shape.

Next, a first metal layer ML1 is formed on the touch substrate 1000 (S200). The first metal layer ML1 is formed by depositing a metal material containing silver nano-wire. In addition, the first metal layer ML1 may be formed by depositing the silver nano-wire and PEDOT-PSS(poly(3,4-ethylenedioxythiophene)poly(styrenesulfonate). Alternatively, any suitable conductive material may be used.

A transparent electrode layer TL is then formed on the first metal layer ML1 (S300). The transparent electrode layer TL may include at least one selected from the group consisting of indium tin oxide (ITO), indium zinc oxide (IZO), indium gallium zinc oxide (IGZO), and aluminum-doped zinc oxide (ZAO), but it should not be limited thereto or thereby.

Subsequently, a second metal layer ML2 is formed on the transparent electrode layer TL (S400). The second metal layer ML2 may include at least one metal material selected from the group consisting of Cu, Ag, Au, Pt, and Al, but they should not be limited thereto or thereby. In this case, the metal material selected from the group consisting of Cu, Ag, Au, Pt, and Al has a low resistance, and thus a low resistance touch screen panel may be realized.

Referring to FIG. 3 again, the first metal layer ML1, the transparent electrode layer TL, and the second metal layer ML2 are patterned to form first and second sensing patterns in the touch active area, and to form the outer lines in the touch non-active area (S500).

Figure 5:
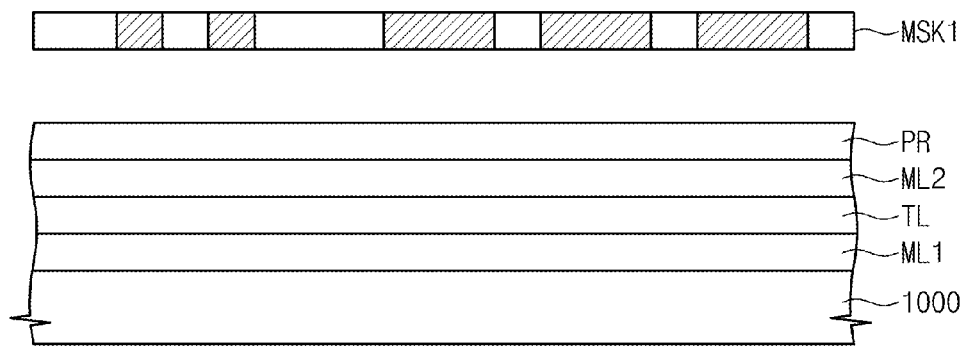
Figure 6:
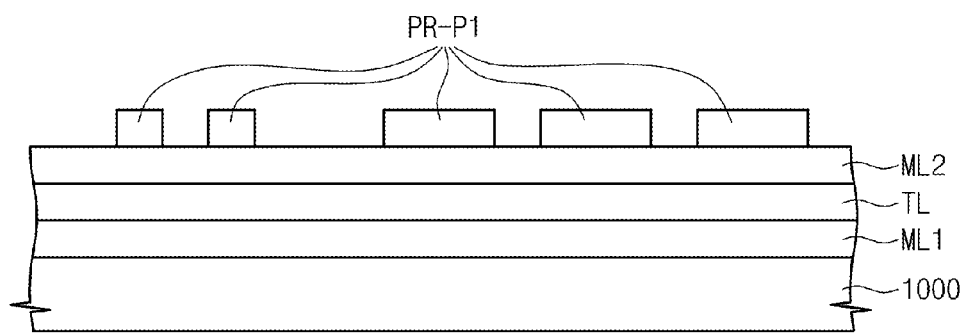

Referring to FIGS. 5 and 6, a photoresist layer PR is formed on the second metal layer ML2 and a first mask MSK1 is disposed above the photoresist layer PR. Then, an exposure and development process is performed on the photoresist layer PR using a first mask MSK, so as to form a first photoresist pattern PR_P1.

Figure 7:
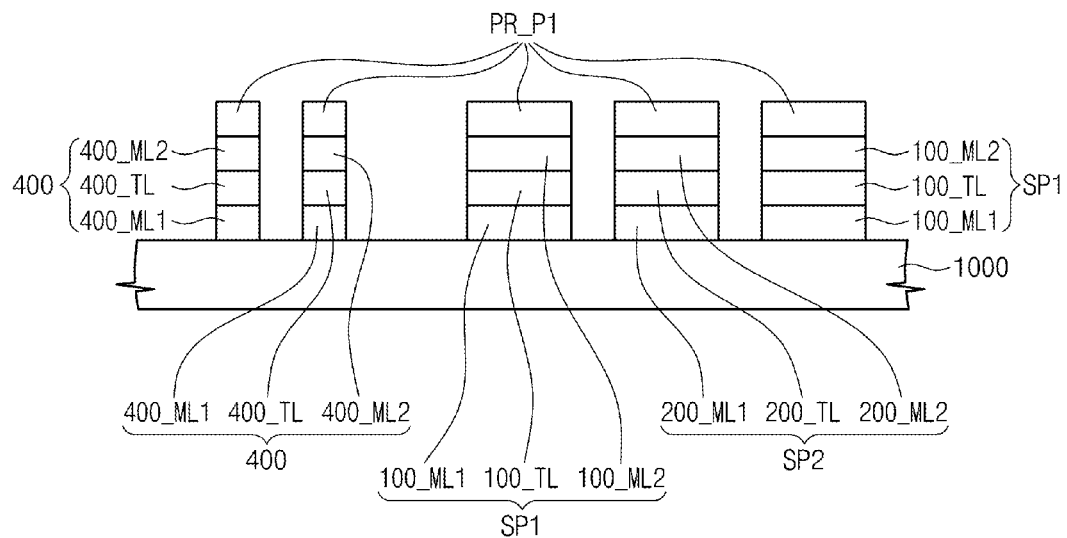

Then, referring to FIG. 7, the first metal layer ML1 the transparent electrode layer TL, and the second metal layer ML2 are patterned using the first photoresist pattern PR_P1 as a mask, and thus the first sensing pattern SP1, the second sensing pattern SP2, and the outer lines 400 are formed. The first sensing pattern SP1 includes the first sensing metal layer 100_ML1, the first transparent sensing electrode layer 100_TL, and the third sensing metal layer 100_ML2; the second sensing pattern SP2 includes the second sensing metal layer 200_ML1, the second transparent sensing electrode 200_TL, and the fourth sensing metal layer 200_ML2, and the outer lines 400 include the first outer metal layer 400_ML1, the transparent outer electrode layer 400_TL, and the second outer metal layer 400_ML2.

Hereinafter, the forming of the touch screen pattern will be described (S600). Referring to FIG. 3 again, the forming of the touch screen pattern (S600) includes selectively etching the third sensing metal layer 100_ML2 of the first sensing pattern and the fourth sensing metal layer 200_ML2 of the second sensing pattern to form the first unit sensing electrodes and the second unit sensing electrodes.

Figure 8:
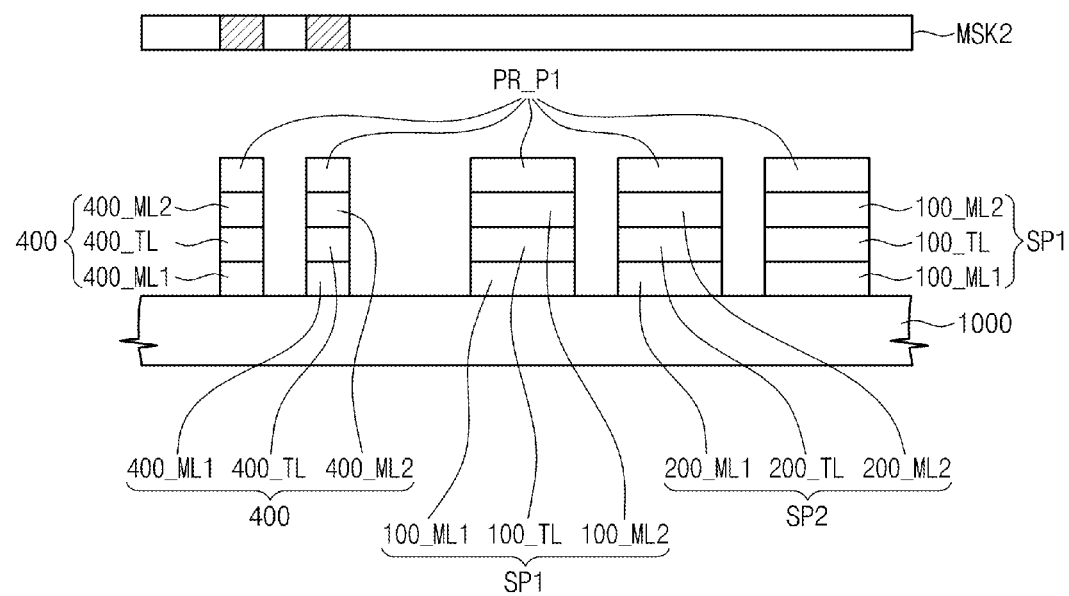
Figure 9:
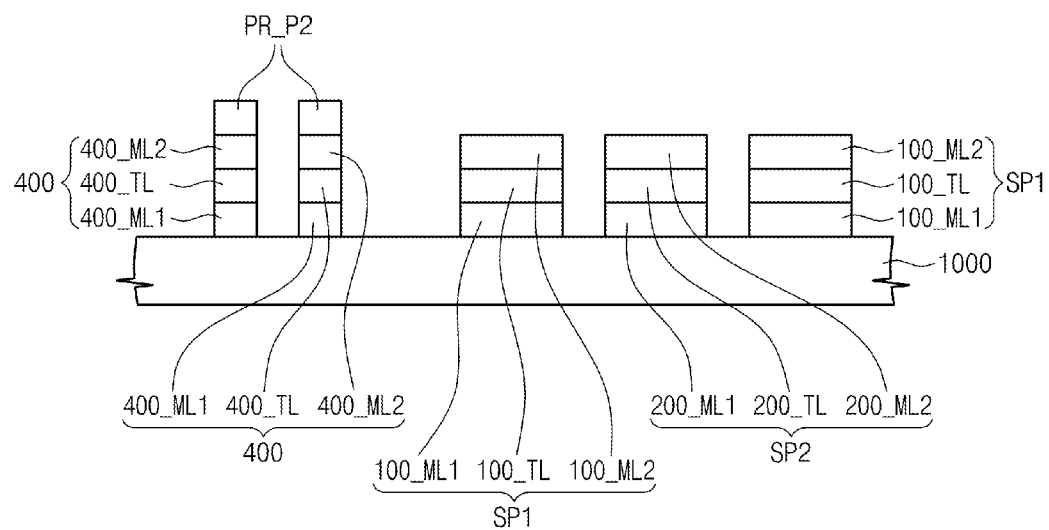

Referring to FIGS. 8 and 9, the first photoresist pattern PR_P1 corresponding to the first sensing pattern SP1 and the second sensing pattern SP2 is selectively patterned using a second mask MSK2 to form a second photoresist pattern PR_P2. That is, the second photoresist pattern PR_P2 is formed only on the outer lines 400.

Figure 10:
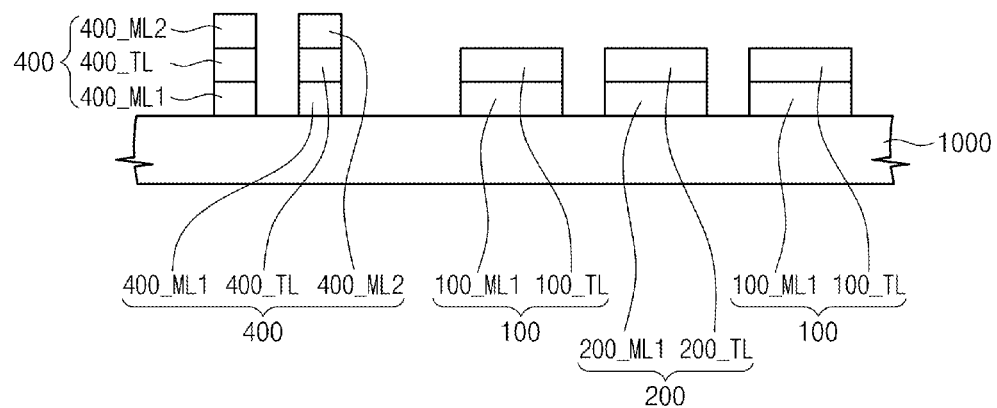

Referring to FIGS. 9 and 10, the third sensing metal layer 100_ML2 of the first sensing pattern SP1 and the fourth sensing metal layer 200_ML2 of the second sensing pattern SP2 are etched using the second photoresist pattern PR_P2 as a mask, and thus the first unit sensing electrodes 100 and the second unit sensing electrodes 200 are formed.

If the second sensing metal layer 200_ML1 and the fourth sensing metal layer 200_ML2 are directly stacked on the first sensing metal layer 100_ML1 and the third sensing metal layer 100_ML2, and the metal materials included in the third and fourth sensing metal layers 100_ML2 and 200_ML2 have electronegativity values similar to those of the metal materials included in the first and second sensing metal layers 100_ML1 and 200_ML1, the first and second sensing metal layers 100_ML1 and 200_ML1 may be etched together with the third and fourth sensing metal layers 100_ML2 and 200_ML2 when the third sensing metal layer 100_ML2 and the fourth sensing metal layer 200_ML2 are etched. Conversely, when the first transparent sensing electrode layer 100_TL is disposed between the first sensing metal layer 100_ML1 and the third sensing metal layer 100_ML2 and the second transparent sensing electrode layer 200_TL is disposed between the second sensing metal layer 200_ML1 and the fourth sensing metal layer 200_ML2, the first and second sensing metal layers 100_ML1 and 200_ML1 may be prevented from being etched together with the third sensing metal layer 100_ML2 and the fourth sensing metal layer 200_ML2. Thus, defects may be prevented from occurring on the outer lines 400, the first sensing electrodes Tx, and the second sensing electrodes Rx. That is, inserting a transparent sensing electrode layer 100_TL between the two metal layers 100_ML1 and 100_ML2, or between 200_ML1 and 200_ML2, can prevent undesired overetching of one of the two metal layers when only the other is meant to be etched.

Alternatively, the forming of the first sensing pattern SP1, the second sensing pattern SP2, and the outer lines 400 (S500) can be performed by a process using only a third mask MSK3.

FIGS. 11 to 15 are cross-sectional views showing a manufacturing method for the touch screen panel using the third mask.

First, a photoresist layer PR is formed on the second metal layer ML2, as explained previously.

Figure 11:
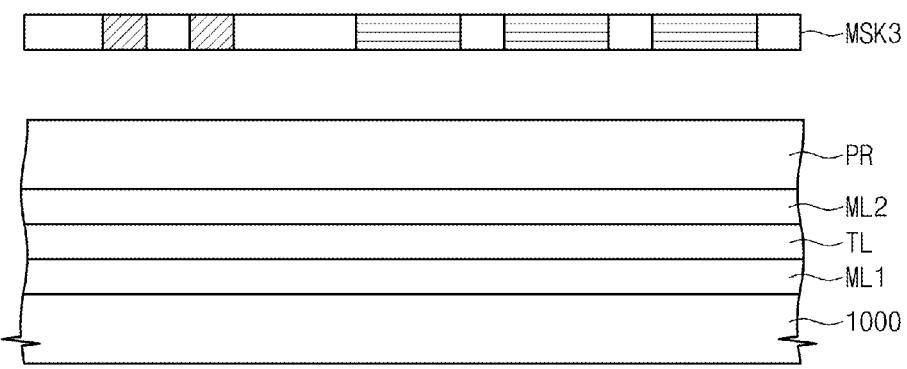
FIGS. 11 to 15 are cross-sectional views showing a manufacturing method of the touch screen panel using a third mask.
Figure 12:
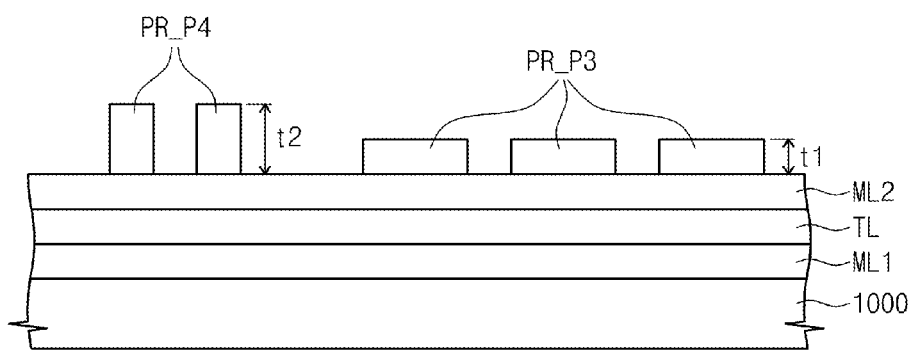

Referring to FIGS. 11 and 12, an exposure and development process is performed on the photoresist layer PR using the third mask MSK3 to form a third photoresist pattern PR_P3 and a fourth photoresist pattern PR_P4. In the present exemplary embodiment, the third mask MSK3 may be a halftone mask.

Figure 13:
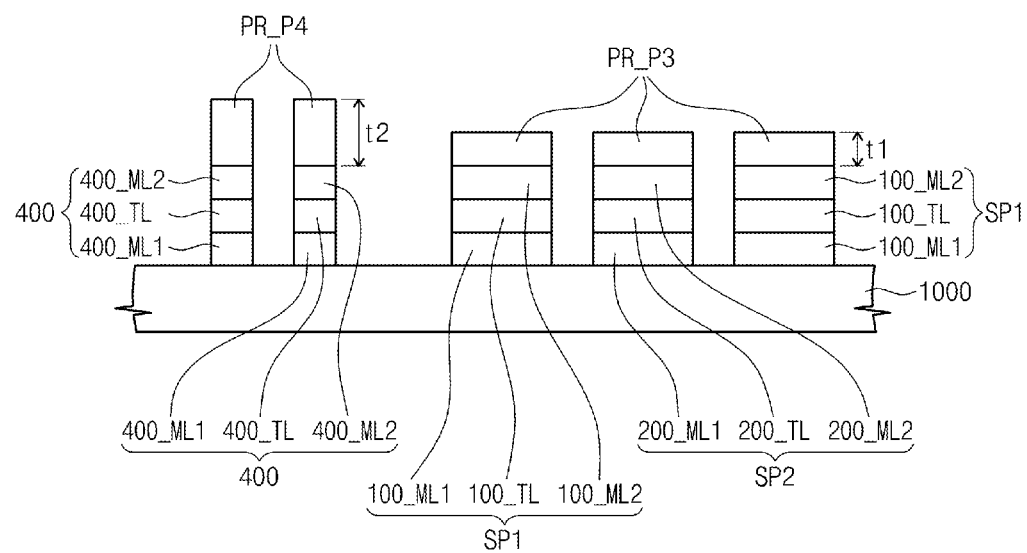

Referring to FIGS. 12 and 13, the third photoresist pattern PR_P3 corresponds to the first and second sensing patterns SP1 and SP2 and has a first thickness t1, and the fourth photoresist pattern PR_P4 corresponds to the outer lines 400 and has a second thickness t2 greater than the first thickness t1.

Then, referring to FIG. 13, the first metal layer ML1, the transparent electrode layer TL, and the second metal layer ML2 are patterned using the third and fourth photoresist patterns PR_P3 and PR_P4 as a mask to form the first sensing pattern SP1, the second sensing pattern SP2, and the outer lines 400. The first sensing pattern SP1 includes the first sensing metal layer 100_ML1, the first transparent sensing electrode layer 100_TL, and the third sensing metal layer 100_ML2; the second sensing pattern SP2 includes the second sensing metal layer 200_ML1, the second transparent sensing electrode layer 200_TL, and the fourth sensing metal layer 200_ML2; and the outer lines 400 include the first outer metal layer 400_ML1, the transparent outer electrode 400_TL, and the second outer metal layer 400_ML2.

Figure 14:
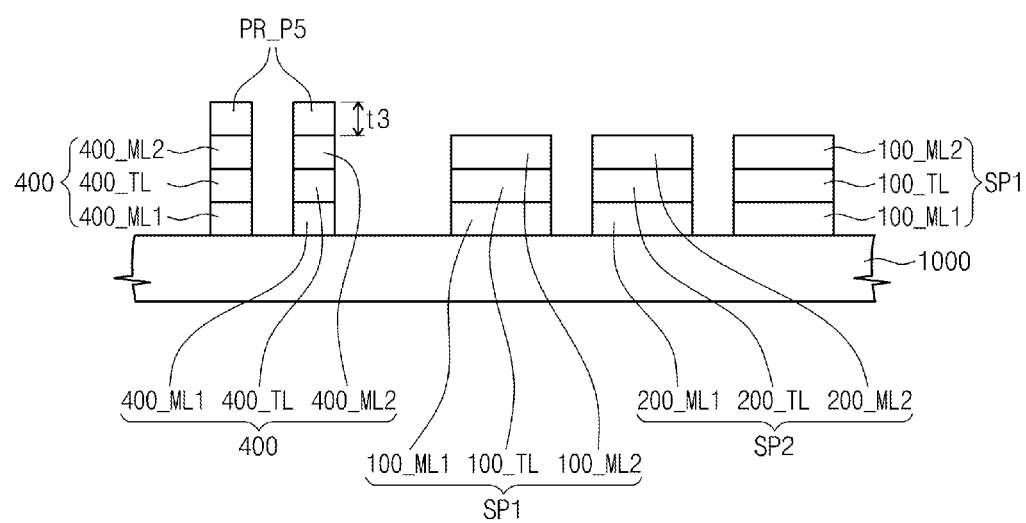

Referring to FIG. 14, a fifth photoresist pattern PR_P5 is formed by etching the third and fourth photoresist patterns PR_P3 and PR_P4 until the third photoresist pattern PR_P3 is completely removed. Thus, the fifth photoresist pattern PR_P5 has a third thickness t3 smaller than the second thickness t2.

Figure 15:
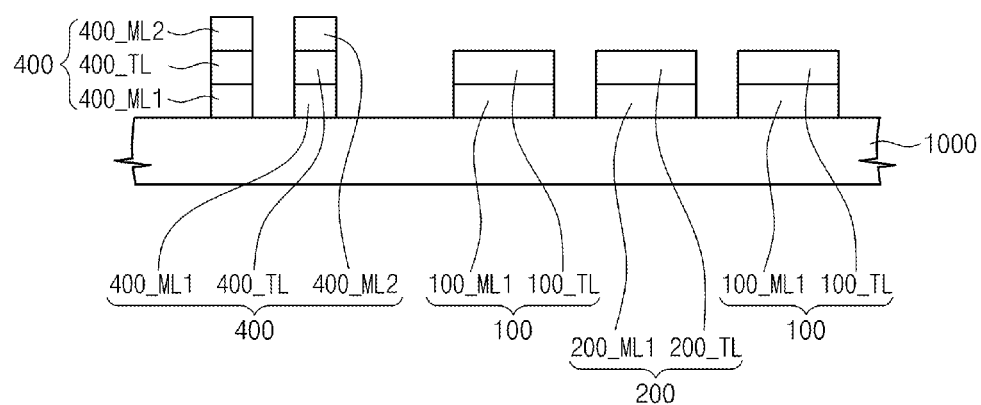

Then, referring to FIGS. 14 and 15, the third sensing metal layer 100_ML2 of the first sensing pattern SP1 and the fourth sensing metal layer 200_ML2 of the second sensing pattern SP2 are etched using the fifth photoresist pattern PR_P5 as a mask. After that, when the fifth photoresist pattern PR_P5 is removed, the first unit sensing electrodes 100, the second unit sensing electrodes 200, and the outer lines 400 are formed.

Figure 16:
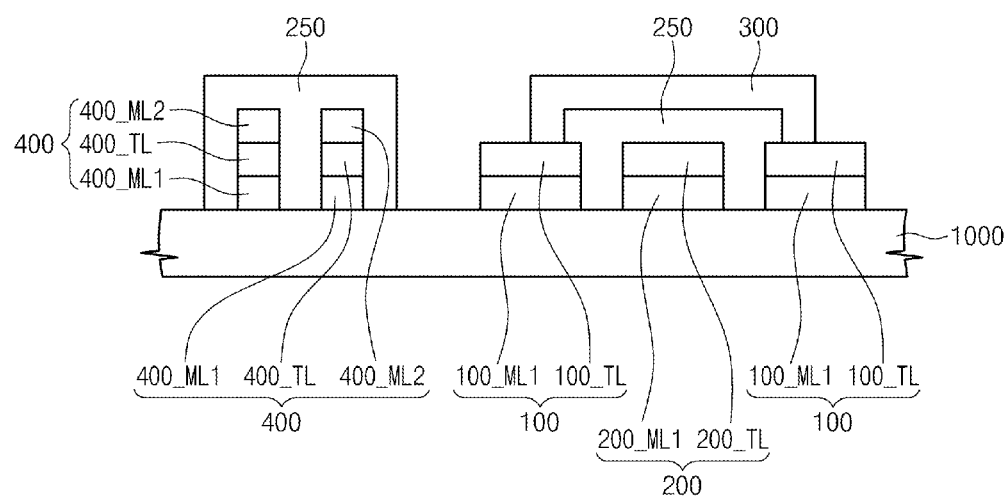
FIG. 16 is a cross-sectional view showing formation of a bridge of the touch screen panel according to an exemplary embodiment of the present disclosure.

FIG. 16 is a cross-sectional view showing a method of forming the bridge on the touch screen panel according to an exemplary embodiment of the present disclosure.

Referring to FIG. 16, a process of forming the insulating layer 250 may be further performed after the forming of the touch screen panel (S600). The insulating layer 250 is disposed on the touch substrate 1000 in known manner to cover the first unit sensing electrodes 100, the second unit sensing electrodes 200, and the outer lines 400 as shown. The first unit sensing electrodes 100, the second unit sensing electrodes 200, and the outer lines 400 are electrically insulated from each other by the insulating layer 250. In addition, a process of forming the bridge 300 may be further performed after the forming of the insulating layer 250. The bridge 300 is disposed above the touch substrate 1000 to connect the first unit sensing electrodes 100 to each other, where the first unit sensing electrodes 100 are spaced apart from each other in the second direction DR2. That is, adjacent first unit sensing electrodes 100 that are spaced apart from each other in the second direction DR2 may be electrically connected to each other by the bridge 300.

In the present exemplary embodiment, the second metal layer ML2 and the bridge 300 may be formed of the same metal material. The bridge 300 may include at least one metal material selected from the group consisting of Cu, Ag, Au, Pt, and Al, but it should not be limited thereto or thereby. Any suitable conductive material is contemplated.

In addition, a process of forming an oxidation preventing layer (not shown) may be further performed after the forming of the bridge 300. As is known, the oxidation preventing layer can be disposed on the touch substrate 1000 to cover the insulating layer 250 and the bridge 300.

Although the exemplary embodiments of the present invention have been described, it is understood that the present invention should not be limited to these exemplary embodiments but various changes and modifications can be made by one ordinary skilled in the art within the spirit and scope of the present invention as hereinafter claimed. Also, various features of the various embodiments described herein can be mixed and matched in any manner, to form further embodiments contemplated by the invention.

What is claimed is:

1. A touch screen panel comprising:
    a touch substrate including a touch active area and a touch non-active area disposed outside the touch active area to substantially surround the touch active area;
    first sensing electrodes positioned so as to collectively extend along a first direction within the touch active area and being spaced apart from each other;
    second sensing electrodes positioned so as to collectively extend along a second direction within the touch active area, the second sensing electrodes spaced apart from each other and insulated from the first sensing electrodes, wherein the second direction crosses the first direction; and
    outer lines disposed in the touch non-active area and connected to the first and second sensing electrodes;
    wherein each of the first sensing electrodes comprises a first sensing metal layer and a first transparent sensing electrode layer disposed on the first sensing metal layer, each of the second sensing electrodes comprises a second sensing metal layer and a second transparent sensing electrode layer disposed on the second sensing metal layer, and each of the outer lines comprises a first outer metal layer, a transparent outer electrode layer disposed on the first outer metal layer, and a second outer metal layer disposed on the transparent outer electrode layer.

2. The touch screen panel of claim 1, wherein the first sensing electrodes comprise a plurality of first unit sensing electrodes arranged in columns of spaced-apart ones of the first unit sensing electrodes, the columns extending along the first direction and being spaced apart from each other along the second direction, and wherein the second sensing electrodes comprise a plurality of second unit sensing electrodes arranged in rows of the second unit sensing electrodes, the rows extending along the second direction and the second unit sensing electrodes of each row being spaced apart from each other and connected to each other along the first direction.

3. The touch screen panel of claim 2, further comprising a bridge disposed on the touch substrate to connect pairs of the first unit sensing electrodes, the first unit sensing electrodes of the pairs being spaced apart from each other in the second direction.

4. The touch screen panel of claim 1, wherein the first sensing metal layer, the second sensing metal layer, and the first outer metal layer comprise a silver nano-wire.

5. The touch screen panel of claim 4, wherein the first sensing metal layer, the second sensing metal layer, and the first outer metal layer comprise PEDOT-PSS(poly(3,4-ethylenedioxythiophene)poly(styrenesulfonate).

6. The touch screen panel of claim 1, wherein the first transparent sensing electrode layer, the second transparent sensing electrode layer, and the transparent outer electrode layer comprise at least one selected from the group consisting of indium tin oxide (ITO), indium zinc oxide (IZO), indium gallium zinc oxide (IGZO), and aluminum-doped zinc oxide (ZAO).

7. The touch screen panel of claim 3, wherein the second outer metal layer and the bridge comprise a same metal material.

8. The touch screen panel of claim 7, wherein the second outer metal layer and the bridge comprise at least one metal material selected from the group consisting of Cu, Ag, Au, Pt, and Al.

9. The touch screen panel of claim 1, wherein the first sensing metal layer, the second sensing metal layer, and the first outer metal layer are disposed on a same layer, and the first transparent sensing electrode layer, the second transparent sensing electrode layer, and the transparent outer electrode layer are disposed on a same layer.

10. A method of manufacturing a touch screen panel, comprising:
    receiving a touch substrate including a touch active area and a touch non-active area disposed outside the touch active area to substantially surround the touch active area;
    forming a first metal layer on the touch substrate;
    forming a transparent electrode layer on the first metal layer;
    forming a second metal layer on the transparent electrode layer;
    patterning the first metal layer, the transparent electrode layer, and the second metal layer to form a first sensing pattern and a second sensing pattern in the touch active area and to form outer lines in the touch non-active area; and
    selectively etching a third sensing metal layer of the first sensing pattern and a fourth sensing metal layer of the second sensing pattern to form first unit sensing electrodes and second unit sensing electrodes and to form a touch screen pattern.

11. The method of claim 10, wherein the forming a first metal layer further comprises depositing a metal material comprising a silver nano-wire.

12. The method of claim 10, wherein the forming a transparent electrode layer further comprises depositing at least one selected from the group consisting of indium tin oxide (ITO), indium zinc oxide (IZO), indium gallium zinc oxide (IGZO), and aluminum-doped zinc oxide (ZAO).

13. The method of claim 10, wherein the forming a second metal layer further comprises depositing at least one selected from the group consisting of Cu, Ag, Au, Pt, and Al.

14. The method of claim 10, wherein the patterning further comprises:
    forming a photoresist layer on the second metal layer;
    performing an exposure and development process on the photoresist layer using a first mask, so as to form a first photoresist pattern; and
    etching the second metal layer, the transparent electrode layer, and the first metal layer using the first photoresist pattern as a mask, so as to form the first and second sensing patterns and the outer lines.

15. The method of claim 14, wherein the selectively etching further comprises:
    selectively etching and removing the first photoresist pattern corresponding to the first and second sensing patterns using a second mask, so as to form a second photoresist pattern; and
    etching the third sensing metal layer of the first sensing pattern and the second sensing metal layer of the second sensing pattern using the second photoresist pattern as a mask.

16. The method of claim 10, wherein the patterning further comprises:
    forming a photoresist layer on the second metal layer;
    performing an exposure and development process on the photoresist layer using a third mask so as to form a third photoresist pattern corresponding to the first and second sensing patterns and having a first thickness, and so as to form a fourth photoresist pattern corresponding to the outer lines and having a second thickness greater than the first thickness; and
    etching the second metal layer, the transparent electrode layer, and the first metal layer using the third and fourth photoresist patterns so as to form the first sensing pattern, the second sensing pattern, and the outer lines.

17. The method of claim 16, wherein the selectively etching further comprises:
    etching the third and fourth photoresist patterns until the third photoresist pattern is substantially completely removed, so as to form a fifth photoresist pattern having a third thickness smaller than the second thickness; and
    etching the third sensing metal layer of the first sensing pattern and the fourth sensing metal layer of the second sensing pattern using the fifth photoresist pattern as a mask.

18. The method of claim 10, further comprising, after the selectively etching, forming an insulating layer on the touch substrate to cover the first unit sensing electrodes, the second unit sensing electrodes, and the outer lines.

19. The method of claim 18, further comprising, after the forming an insulating layer, forming a bridge on the touch substrate to connect pairs of the first unit sensing electrodes.

20. The method of claim 19, wherein the second metal layer and the bridge comprise a same metal material.

21. The method of claim 19, wherein the bridge comprises at least one metal material selected from the group consisting of Cu, Ag, Au, Pt, and Al.

* * * * *